(12) United States Patent
Sugita

(10) Patent No.: US 10,040,979 B2
(45) Date of Patent: Aug. 7, 2018

(54) THERMALLY CONDUCTIVE SHEET

(71) Applicant: Dexerials Corporation, Tokyo (JP)

(72) Inventor: Junichiro Sugita, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/911,451

(22) PCT Filed: Sep. 10, 2014

(86) PCT No.: PCT/JP2014/073954
§ 371 (c)(1),
(2) Date: Feb. 10, 2016

(87) PCT Pub. No.: WO2015/037626
PCT Pub. Date: Mar. 19, 2015

(65) Prior Publication Data
US 2016/0194529 A1    Jul. 7, 2016

(30) Foreign Application Priority Data

Sep. 13, 2013 (JP) .................................. 2013-190090
Sep. 10, 2014 (JP) .................................. 2014-183931

(51) Int. Cl.
| | | |
|---|---|---|
| C09J 7/20 | (2018.01) | |
| C09J 133/08 | (2006.01) | |
| C09J 133/06 | (2006.01) | |
| C09J 9/00 | (2006.01) | |
| C09J 11/04 | (2006.01) | |
| C09J 11/06 | (2006.01) | |
| C08K 3/20 | (2006.01) | |
| C08K 3/08 | (2006.01) | |
| C08K 3/04 | (2006.01) | |
| H01L 23/373 | (2006.01) | |
| C09J 7/38 | (2018.01) | |
| C09J 7/24 | (2018.01) | |
| C08K 3/32 | (2006.01) | |
| C08K 5/3492 | (2006.01) | |

(52) U.S. Cl.
CPC ............ *C09J 133/08* (2013.01); *C08K 3/041* (2017.05); *C08K 3/20* (2013.01); *C09J 7/241* (2018.01); *C09J 7/245* (2018.01); *C09J 7/385* (2018.01); *C09J 9/00* (2013.01); *C09J 11/04* (2013.01); *C09J 11/06* (2013.01); *C09J 133/06* (2013.01); *H01L 23/3737* (2013.01); *C08K 3/08* (2013.01); *C08K 5/34924* (2013.01); *C08K 2003/328* (2013.01); *C09J 2201/122* (2013.01); *C09J 2201/602* (2013.01); *C09J 2203/326* (2013.01); *C09J 2205/102* (2013.01); *C09J 2205/106* (2013.01); *C09J 2400/10* (2013.01); *C09J 2400/20* (2013.01); *C09J 2413/006* (2013.01); *C09J 2433/00* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 5,814,685 A | * | 9/1998 | Satake | C09D 11/326 347/100 |
| 6,037,054 A | * | 3/2000 | Shirai | C09J 123/22 428/356 |
| 6,207,272 B1 | * | 3/2001 | Takahira | C09J 7/0217 427/208.4 |
| 7,070,051 B2 | * | 7/2006 | Kanner | A61B 17/06133 206/382 |
| 7,863,182 B2 | * | 1/2011 | Matsumura | C09J 7/02 438/628 |
| 2006/0249714 A1 | | 11/2006 | Hiroshige et al. | |
| 2007/0179223 A1 | | 8/2007 | Hiroshige et al. | |
| 2008/0227909 A1 | | 9/2008 | Yoda et al. | |

(Continued)

FOREIGN PATENT DOCUMENTS

| | | |
|---|---|---|
| CN | 1774475 A | 5/2006 |
| CN | 1918230 A | 2/2007 |

(Continued)

OTHER PUBLICATIONS

Aldrich Data Sheet (2017).*

(Continued)

*Primary Examiner* — Frank D Ducheneaux
(74) *Attorney, Agent, or Firm* — Procopio, Cory, Hargreaves & Savitch LLP

(57) ABSTRACT

A thermally conductive sheet having an adhesive layer and a non-adhesive layer laminated together. The adhesive layer contains an acrylic resin formed from an acrylic compound and a thermally conductive filler, and has a tack property higher than a tack property of the non-adhesive layer. The non-adhesive layer is formed from a resin having a glass transition temperature of 10° C. or more and at least one functional group selected from a hydroxy, a carboxyl and a glycidyl, a curing agent and a flame retardant filler. The tack property of the non-adhesive layer is from 6 to 30 kN/m² measured by pressing and then peeling an aluminum cylindrical probe from the non-adhesive layer with a pressing speed of 30 mm/min, peeling speed of 120 mm/min, load of 196 g, pressing time of 5.0 sec, pulling distance of 5 mm, probe heating of 40° C. and sheet stage heating of 40° C.

20 Claims, No Drawings

(56) References Cited

U.S. PATENT DOCUMENTS

2009/0264573 A1* 10/2009 Maeda .................. C08F 265/02
                                                          524/436
2012/0301716 A1   11/2012   Terada et al.
2014/0037924 A1    2/2014   Furuta et al.
2016/0009963 A1    1/2016   Sugita

FOREIGN PATENT DOCUMENTS

| CN | 102753637 A | 10/2012 |
|---|---|---|
| CN | 105008480 A | 10/2015 |
| JP | 3498823 B | 11/1997 |
| JP | 2002-069400 A | 3/2002 |
| JP | 2002-121508 A | 4/2002 |
| JP | 2003-321658 A | 11/2003 |
| JP | 2004-225022 A | 8/2004 |
| JP | 2004225022 A | 8/2004 |
| JP | 2006-307209 A | 11/2006 |
| JP | 2007-123624 A | 5/2007 |
| JP | 2010-093077 A | 4/2010 |
| TW | 201137078 A | 11/2011 |
| TW | 201241141 A | 10/2012 |
| WO | 2010035614 | 4/2010 |
| WO | 2011096287 | 8/2011 |

OTHER PUBLICATIONS

Machine translation of JP 2003321658 A (2003).*
International Search Report and Written Opinion for PCT/JP2014/073954 dated Nov. 18, 2014, 10 pgs.
Office Action for Chinese Patent Application No. 201480048300.5 dated Aug. 29, 2017; 8 pages. English translation provided.
Office Action for Taiwanese Patent Application No. 103131516 dated Oct. 16, 2017; 5 pages. English translation provided.

\* cited by examiner

THERMALLY CONDUCTIVE SHEET

This application is the U.S. National Stage of International Application No. PCT/JP2014/073954, filed Sep. 10, 2014, and claims benefit of priority from JP Patent Application No. 2013-190090, filed Sep. 13, 2013 and JP Patent Application No. 2014-183931, filed Sep. 10, 2014, the contents of which are incorporated by reference.

TECHNICAL FIELD

The present invention relates to a thermally conductive sheet which is adhered to an electronic component and the like to increase its heat dissipation performance.

BACKGROUND ART

The thermally conductive sheet is used for filling a gap between an electronic component, which is a heat source, and the like, and a heat sink, for example, a heat dissipation plate or a chassis to increase the heat dissipation performance of electronic component. As the thermally conductive sheet, a thermally conductive sheet having an adhesion property is preferred in order to bond to a prescribed place. Also, a thermally conductive sheet in which an adhesion property of opposite surface is high and an adhesion property of the other surface is low is preferred from the standpoint of reworkability, for example, to correct a position deviation at the time of assembling of the electronic component and the heat sink or to enable reassembling after once assembled and disassembled for any reason.

Thus, in the formation of thermally conductive sheet from a silicone rubber and a thermally conductive filler, it is proposed to apply a non-adhesive treatment to a surface of the sheet by ultraviolet ray irradiation (Patent Document 1).

Also, an adhesive thermally conductive sheet containing an acrylic polyurethane resin, a non-functional acrylic polymer and a thermally conductive filler, wherein a blend ratio of the acrylic polyurethane resin and the non-functional acrylic polymer is differentiated between a surface layer and a back layer and the both layers are coated superposedly to vary the adhesion property on the front side and the back side of adhesive thermally conductive sheet is proposed (Patent Document 2).

PRIOR ART DOCUMENT

Patent Document

Patent Document 1: Japanese Patent No. 3,498,823
Patent Document 2: JP-A-2010-93077

DISCLOSURE OF THE INVENTION

Problems that the Invention is to Solve

However, when the ultraviolet ray irradiation is performed in order to decrease the adhesion property of one surface of the thermally conductive sheet as described in Patent Document 1, the layer contributing the thermal conductivity is deteriorated.

Also, in the case where a blend ratio of the acrylic polyurethane resin and the non-functional acrylic polymer is differentiated in a surface layer and a back layer and the both layers are coated superposedly as described in Patent Document 2, since the surface layer and the back layer are easily mixed, it is difficult to vary the adhesion property in the surface layer and the back layer as desired.

In addition, as a method for differentiating the adhesion property on the front side and the back side of thermally conductive sheet, a method wherein in the case of forming an adhesive thermally conductive layer from an acrylic polymer and a thermally conductive filler, a non-adhesive film is laminated on one surface of the layer is considered, but in this case, there is a concern that the adhesion between the film and the adhesive thermally conductive layer is insufficient to cause peeling between the layers at the time of work. Further, since an attachment property of the film to an object is enormously decreased, the workability as the thermally conductive sheet is deteriorated.

Also, to the sheet mounted is applied continuously temperature exceeding 100° C. In such a situation, even a resin having a considerably high glass transition temperature may soften to adhere (fix) to a material to be adhered, for example, aluminum.

In contrast, an object of the invention is to improve the workability of thermally conductive sheet in which an adhesive thermally conductive layer is formed from an acrylic polymer and a thermally conductive filler by forming a layer having an appropriate adhesion property, which is lower than the adhesion property of the adhesive thermally conductive layer, on one surface of the adhesive thermally conductive layer, and also to improve the reworkability after storage at a high temperature in the case of disassembling the mounted article used at a high temperature for a long period of time.

Means for Solving the Problems

The inventor has found that the object described above can be achieved by laminating a resin layer having a specific tack property using a resin having a specific glass transition temperature on one surface of an adhesive thermally conductive layer formed from an acrylic polymer and a thermally conductive filler to complete the invention.

Specifically, the invention relates to items described in (1) to (7) below.
(1) A thermally conductive sheet in which an adhesive thermally conductive layer and a non-adhesive resin layer are laminated, wherein the adhesive thermally conductive layer contains an acrylic resin formed by curing an acrylic compound and a thermally conductive filler, and a tack property of the adhesive thermally conductive layer is higher than a tack property of the non-adhesive resin layer, and the non-adhesive resin layer is formed from a resin composition containing a resin having a glass transition temperature of 10° C. or more and containing at least one functional group selected from a hydroxy group, a carboxyl group and a glycidyl group, a curing agent and a flame retardant filler, and the tack property of the non-adhesive resin layer is from 6 to 30 kN/m² as a probe tack measured by pressing an aluminum cylindrical probe on the non-adhesive resin layer and then peeling the aluminum cylindrical probe from the non-adhesive resin layer under conditions of pressing speed of 30 mm/min, peeling speed of 120 mm/min, load of 196 g, pressing time of 5.0 sec, pulling distance of 5 mm, probe heating of 40° C. and sheet stage heating of 40° C.
(2) The thermally conductive sheet as described in (1), wherein the flame retardant filler is an organic filler selected from a cyanuric acid compound and an organic phosphate.
(3) The thermally conductive sheet as described in (1) or (2), wherein an average particle diameter of the flame retardant filler is from 0.1 to 25 μm.

(4) The thermally conductive sheet as described in any one of (1) to (3), wherein a heat conductivity in a thickness direction of the thermally conductive sheet is 1.5 W/m·K or more.

(5) The thermally conductive sheet as described in any one of (1) to (4), wherein a glass transition temperature of the acrylic resin in the adhesive thermally conductive layer is from −80 to 15° C.

(6) The thermally conductive sheet as claimed in any one of (1) to (5), wherein the acrylic compound forming the adhesive thermally conductive layer is a monofunctional (meth) acrylate monomer.

(7) The thermally conductive sheet as claimed in any one of (1) to (6), wherein the adhesive thermally conductive layer contains from 20 to 80 parts by weight of a plasticizer and from 100 to 2,000 parts by weight of the thermally conductive filler based on 100 parts by weight of a monomer unit of the acrylic compound.

Advantage of the Invention

According to the thermally conductive sheet of the invention, since the adhesive thermally conductive layer and the non-adhesive resin layer are laminated and the tack property of the non-adhesive resin layer is an appropriate value, which is lower than the tack property of the adhesive thermally conductive layer, the workability in the case of assembling an electronic component and a heat sink using the thermally conductive sheet is improved and the reworkability in the case where the article once assembled is used for a long period of time, disassembled and reassembled is also improved.

MODE FOR CARRYING OUT THE INVENTION

The invention will be described in detail hereinafter.

In the thermally conductive sheet according to the invention, the adhesive thermally conductive layer and the non-adhesive resin layer are laminated.

In the adhesive thermally conductive layer, a thermally conductive filler is dispersed in an acrylic resin formed by curing an acrylic compound. In the invention, for the purpose of bonding the thermally conductive sheet to a prescribed place of an electronic component or a heat sink to set, the tack property higher than that of the non-adhesive resin layer is imparted to the adhesive thermally conductive layer. Therefore, as the acrylic compound, an acrylic compound a cured product of which, that is, an acrylic resin, has a glass transition temperature preferably from −80 to 15° C. is used. As such an acrylic compound, a monofunctional (meth)acrylate, for example, 2-ethylhexyl (meth)acrylate, lauryl (meth)acrylate, n-butyl (meth)acrylate, isobutyl (meth)acrylate, isononyl (meth)acrylate, 2-hydroxyethyl (meth)acrylate or 4-hydroxybutyl (meth)acrylate is exemplified. Among them, 2-ethylhexyl (meth)acrylate or lauryl acrylate is preferred.

Also, one or more of monomers copolymerizable with the acrylic compound, for example, (meth)acrylic acid, N-vinylpyrrolidone, itaconic acid, tetrahydrofurfuryl acrylate, ethyl (meth)acrylate, 2-hydroxyethyl (meth)acrylate, 2-hydroxypropyl (meth)acrylate, isobornyl (meth)acrylate, ethoxyethyl (meth)acrylate, butoxyethyl (meth)acrylate, phenoxyethyl (meth)acrylate, phenyl (meth)acrylate and cyclohexyl (meth)acrylate may be used in mixture.

As the curing method of the acrylic compound, for example, a method of using a photopolymerization initiator, a photocuring agent or the like, and irradiating an ultraviolet ray is exemplified. In this case, when a long wavelength ultraviolet ray (wavelength from 320 to 400 nm) is irradiated only in an energy amount necessary for cleavage of the photopolymerization initiator, the problem in that the adhesive thermally conductive layer is deteriorated by the ultraviolet ray irradiation is eliminated.

As the thermally conductive filler contained in the adhesive thermally conductive layer, a metal hydroxide, for example, aluminum hydroxide or magnesium hydroxide, metal, for example, aluminum, copper or silver, a metal oxide, for example, alumina or magnesia, a nitride, for example, aluminum nitride, boron nitride or silicon nitride, a carbon nanotube or the like can be used. The average particle diameter of the thermally conductive filler is preferably from 0.5 to 100 μm, and in particular, from the standpoint of dispersibility and thermal conductivity, it is preferred to use a small diameter filler having the average particle diameter from 3 to 20 μm and a large diameter filler having the average particle diameter from 25 to 100 μm in combination.

The content of the thermally conductive filler in the adhesive thermally conductive layer is preferably from 100 to 2,000 parts by weight, more from 300 to 1,000 parts by weight, based on 100 parts by weight of a monomer unit based on the acrylic compound described above. When the content of the thermally conductive filler is too small, the thermal conductivity of the thermally conductive sheet cannot be sufficiently increased, on the contrary, when it is too large, the flexibility of the thermally conductive sheet degrades, and thus it is not preferred.

In the case of using two kinds of thermally conductive fillers having different average particle diameters in the adhesive thermally conductive layer, a blend ratio of the small diameter filler and the large diameter filler is preferably from 15:85 to 90:10.

Also, it is preferred to incorporate into the adhesive thermally conductive layer one or more plasticizers selected from, for instance, an adipic acid compound, for example, dioctyl adipate or diisononyl adipate, a sebacic acid compound, for example, octyl sebacate or diisodecyl sebacate, a phosphoric acid compound, for example, tricresyl phosphate, castor oil or a derivative thereof, a higher fatty acid, for example, stearic acid or oleic acid, or a derivative thereof, a phthalic acid compound, for example, dibutyl phthalate or dioctyl phthalate, a low molecular weight acrylic polymer, wax and a tackifier. The content of the plasticizer in the adhesive thermally conductive layer is preferably from 20 to 80 parts by weight, more from 30 to 70 parts by weight, based on 100 parts by weight of a monomer unit based on the acrylic compound described above.

In addition, an antioxidant, a thermal degradation inhibitor, a flame retardant, a coloring agent and the like may be blended into the adhesive thermally conductive layer, if desired.

The layer thickness of the adhesive thermally conductive layer is preferably from 200 to 3,000 μm. When it is too thin, a sufficient followability to irregularities of the material to be adhered cannot be obtained, and when it is too thick, it takes time for curing the layer, thereby deteriorating the productivity.

On the other hand, the tack property of the non-adhesive resin layer is from 6 to 30 kN/m$^2$, preferably from 7 to 28 kN/m$^2$, as a probe tack measured by pressing an aluminum cylindrical probe at temperature of 40° C. on the non-adhesive resin layer and then peeling the aluminum cylindrical probe from the non-adhesive resin layer under conditions of pressing speed of 30 mm/min, peeling speed of 120 mm/min, load of 196 g, pressing time of 5.0 sec, pulling distance of 5 mm, probe heating of 40° C. and sheet stage heating of 40° C.

By setting the tack property of the non-adhesive resin layer to the range described above, in the case of assembling an electronic component and a heat sink using the thermally conductive sheet, the non-adhesive resin layer is not sticky, but exhibits an appropriately low adhesion property, whereby not only the workability is improved but also the reworkability is improved in the case of reassembling the article.

In order to set the tack property of the non-adhesive resin layer to the range described above, as to the resin for forming the non-adhesive resin layer, a resin having a preferable glass transition temperature of 10° C. or more and containing at least one functional group selected from a hydroxy group, a carboxyl group and a glycidyl group is used. Also, in the non-adhesive resin layer, an appropriate curing agent is blended depending on the functional group of the resin. Thus, regardless of the presence or absence of the compatibility with the acrylic compound forming the adhesive thermally conductive layer, the tack property of the non-adhesive resin layer can be significantly reduced and at the same time, adherence to a material to be adhered (for example, aluminum) at the time of high temperature storage can be inhibited.

On the contrary, in the case where the resin forming the non-adhesive resin layer does not have the functional group described above, it is difficult to set the tack property of the non-adhesive resin layer to 30 kN/m$^2$ or less, even when the curing agent is used.

Also, in the case where the glass transition temperature of the resin forming the non-adhesive resin layer is less than 10° C., it is difficult to set the tack property of the non-adhesive resin layer to 30 kN/m$^2$ or less by using the curing agent. In particular, when the compatibility with the acrylic compound forming the adhesive thermally conductive layer is high, in the case where the coating compositions for forming by coating the adhesive thermally conductive layer and the non-adhesive resin layer are coated superposedly to form a laminate of both layers, the both layers are apt to be mixed at their interface so that it is difficult to impart the desired tack property to the non-adhesive resin layer.

The upper limit of the glass transition temperature of the resin forming the non-adhesive resin layer is preferably set to 110° C. or less from the standpoint that the non-adhesive resin layer exhibits the appropriately low adhesion property and achieves the adhesion strength to the adhesive thermally conductive layer.

As a resin which is preferred for forming the non-adhesive resin layer, that is, a resin which has a glass transition temperature of 10° C. or more and contains at least one functional group selected from a hydroxy group, a carboxyl group and a glycidyl group, a polyvinyl butyral resin having a hydroxy group as the functional group, an acrylic rubber or a polyurethane resin having a hydroxy group or a glycidyl group as the functional group and the like are exemplified. The molecular weight of the resin is preferably from 100,000 to 500,000 in terms of number average molecular weight.

Further, according to the invention, a flame retardant filler is incorporated into the non-adhesive resin layer. As the flame retardant filler, an organic filler is preferred because it is difficult to precipitate and is easy to be uniformly dispersed in the non-adhesive resin layer. As the organic filler, a cyanuric acid compound, for example, melamine cyanurate, and an organic phosphate, for example, melamine polyphosphate or ammonium polyphosphate are exemplified. The flame retardant fillers may be used individually or in combination of two or more thereof.

The average particle diameter of the flame retardant filler is preferably from 0.1 to 25 μm, more preferably from 0.5 to 20 μm, from the standpoint of stability of dispersion and coating property (appearance). Also, the content of the flame retardant filler in the non-adhesive resin layer is preferably from 3 to 30 parts by weight, based on 100 parts by weight of the resin forming the non-adhesive resin layer. Thus, the surface irregularity derived from the flame retardant filler is formed on the surface of non-adhesive resin layer so that stickiness of the surface of non-adhesive resin layer can be prevented to improve the workability, and also in the case where the non-adhesive resin layer is formed by coating with a coater, coating traces become less conspicuous to improve the appearance.

The layer thickness of the non-adhesive resin layer is preferably from 0.5 to 25 μm, and more preferably from 1 to 20 μm. When the layer thickness of the non-adhesive resin layer is too thin, the adhesion property increases due to compatibilizing with the adhesive thermally conductive layer and rubbing damage caused by the thermally conductive filler, and when, it is too thick, the thermal conductivity of the thermally conductive sheet becomes insufficient.

As to the thermal conductivity of the thermally conductive sheet, a heat conductivity in the thickness direction of the thermally conductive sheet is practically required to be 1 W or more according to measurement by the thermal gradation method in conformity with ASTM D5470, and according to the invention, the heat conductivity can be set to 1.5 W/m·K or more, and more preferably 2 W/m·K or more.

As to a method for manufacturing the thermally conductive sheet according to the invention, the thermally conductive sheet according to the invention can be obtained, for example, by preparing a coating material for forming the adhesive thermally conductive layer in which the respective components for forming the adhesive thermally conductive layer described above are mixed with a solvent and a coating material for forming the non-adhesive resin layer in which the respective components for forming the non-adhesive resin layer are mixed with a solvent, respectively, coating sequentially the coating material for forming the non-adhesive resin layer and the coating material for forming the adhesive thermally conductive layer on a release film formed from PET, PEN, polyolefin, glassine paper or the like in the prescribed coating thickness, covering the coated surface of the coating material for forming the adhesive thermally conductive layer with a cover film of PEN, polyolefin, glassine paper or the like, and irradiating an ultraviolet ray through the cover film to cure the coated layer of the coating material for forming the adhesive thermally conductive layer.

Also, the thermally conductive sheet according to the invention can be manufactured by coating the coating material for forming the non-adhesive resin layer on a release film, followed by drying, on the other hand, by coating the coating material for forming the adhesive thermally conductive layer on a cover film, followed by drying, superposing the coated layer of the coating material for forming the non-adhesive resin layer and the coated layer of the coating material for forming the adhesive thermally conductive layer so as to face the coated surfaces of the layers, and irradiating an ultraviolet ray from the cover film side to cure the coated layer of the coating material for forming the adhesive thermally conductive layer.

After the manufacturing the thermally conductive sheet as described above, the release film is peeled off, and the thermally conductive sheet is wound in the state of attaching with the cover film to be stored. The thermally conductive sheet wound as described above is used for assembly of an electronic component and a heat sink by peeling off the cover film.

EXAMPLES

The invention will be described specifically with reference to the examples below.

Examples 1 and 2 and Comparative Examples 1 to 3

The resin, the curing agent and the flame retardant filler shown in Table 1 were dissolved in a mixed solvent of toluene and methyl ethyl ketone (1:1 in weight ratio) to prepare a coating solution having a solid content of 10% by weight, and the coating solution was coated on a PET film by a bar coater and dried at 90° C. for one minute and then at 140° C. for 5 minutes to from a non-adhesive resin layer having the coating thickness shown in Table 1. In Table 1, a "part" denotes a part by weight. The average particle diameter of melamine cyanurate (STABIACE MC-5S produce by Sakai Chemical Industry Co., Ltd.) used as the flame retardant filler is about one µm.

On the other hand, 100 parts by weight of 2-ethylhexyl acrylate as a monofunctional acrylate, 47 parts by weight of castor oil-derived fatty acid ester, 1.4 parts by weight of a photopolymerization initiator (IRGACURE 819, BASF), 1.5 parts by weight of hydroxypivalic acid neopentyl glycol diacrylate (KAYARAD FM-400, Nippon Kayaku Co., Ltd.) as a curing agent, 400 parts by weight of aluminum hydroxide powder (average particle diameter: 80 µm) as a thermally conductive filler, and 400 parts by weight of aluminum hydroxide powder (average particle diameter: 8 µm) were mixed to prepare a coating material for forming the adhesive thermally conductive layer. The glass transition temperature of a cured product of the 2-ethylhexyl acrylate was from −50 to −40° C.

The coating material for forming the adhesive thermally conductive layer thus prepared was coated superposedly on the non-adhesive resin layer described above with a coating thickness of 2 mm, a transparent cover film made of PET and the like subjected to a release treatment with silicone or the like on one side thereof was covered on the adhesive thermally conductive layer, and a long wavelength ultraviolet ray was irradiated for 5 minutes with a chemical lamp from both the PET film side and the cover film side, thereby manufacturing the thermally conductive sheets of Examples 1 and 2 and Comparative Examples 1 to 3, respectively.

Examples 3 and 4

In Example 2 described above, 12 parts of an isocyanate curing agent (CORONATE L produced by Nippon Polyurethane Industry Co., Ltd.) or 12 parts of hydrazide curing agent (UHD produced by Ajinomoto Fine-Techno Co., Inc.) was used in place of the imidazole curing agent as the curing agent blended in the non-adhesive resin layer to manufacture the thermally conductive sheets of Examples 3 and 4, respectively.

Evaluation

With respect to the thermally conductive sheet of each of the examples and the comparative examples, (a) tack property of the non-adhesive resin layer, (b) appearance of the non-adhesive resin layer, (c) heat conductivity of the thermally conductive sheet, and (d) reworkability of the thermally conductive sheet after storage under a high temperature circumstance were evaluated in the manner described below. The results of Examples 1 and 2 and Comparative Examples 1 to 3 are shown in Table 1. The same results as in Example 2 were obtained in Examples 3 and 4

(a) Tack Property of the Non-Adhesive Resin Layer

Using Tacking Test Machine TAC-II produced by Rhesca Co., Ltd. as the tack property test machine, a probe tack was measured by pressing at temperature of 40° C. an aluminum cylindrical probe having a diameter of 5 mm on the non-adhesive resin layer and then peeling the aluminum cylindrical probe from the non-adhesive resin layer under conditions of pressing speed of 30 mm/min, peeling speed of 120 mm/min, load of 196 g, pressing time of 5.0 sec, pulling distance of 5 mm, probe heating of 40° C. and sheet stage heating of 40° C. As to the thermally conductive sheet of Comparative Example 3, since the non-adhesive resin layer was not present, the tack property of the adhesive thermally conductive layer was measured. From the measurement value of probe tack, the tack property was evaluated according to the criteria shown below.

Too small: less than 6 kN/m$^2$
Good: from 6 to 30 kN/m$^2$
Too large: more than 30 kN/m$^2$ (b) Appearance of the Non-Adhesive Resin Layer The appearance of the non-adhesive resin layer was visually observed and evaluated according to the criteria shown below.

A: Uniform coated film free from unevenness
B: Unevenness was recognized by oblique light observation
C: Repelling was recognized on the coated film (c) Heat Conductivity of the Thermally Conductive Sheet The heat conductivity in the thickness direction of the thermally conductive sheet was measured by a heat conductivity meter (produced by Sony Corp.) in conformity with ASTM D 5470 (heater output of 8 W, sheet surface pressure of 1 kgf/cm$^2$).

(c) Reworkability after Storage at High Temperature

The thermally conductive sheet was placed on an aluminum plate so as to contact the non-adhesive resin layer side thereof with the aluminum plate, stored in an environmental test chamber set at 125° C. for 100 hours, taken out, cooled to room temperature, and peeled from the aluminum plate. At the time, the case where the non-adhesive resin layer and the adhesive thermally conductive layer of the thermally conductive sheet were peeled from the aluminum plate without separation was evaluated as O, and the case where the layers were separated and the non-adhesive resin layer was remained on the aluminum plate was evaluated as X.

The results of the tack property of the non-adhesive resin layer at 40° C. are set forth below.
Example 1: 6.4 kN/m
Example 2: 25.8 kN/m$^2$
Comparative Example 1: 6.2 kN/m$^2$
Comparative Example 2: 58.2 kN/m$^2$
Comparative Example 3: 68.4 kN/m$^2$ From Table 1, it can be seen that in both Example 2 wherein the glass transition temperature of the resin forming the non-adhesive resin layer is relatively low as 11° C. and the curing agent is blended and Example 1 wherein the glass transition temperature of the resin forming the non-adhesive resin layer is high as 90° C. and the curing agent is blended, the probe tack of the non-adhesive resin layer is from 6 to 30 kN/m² and the non-adhesive resin layer exhibits the adequate adhesion property so that the workability of the thermally conductive sheet is good. It can also be seen that in the thermally conductive sheets of Example 1 and Example 2, the reworkability after the storage at a high temperature is good and the appearance of the non-adhesive resin layer is also good. In particular, in Example 1, due to the high glass transition point Tg of the resin forming the non-adhesive resin layer, the reworkability after the storage at a high temperature is extremely good.

On the other hand, it can be seen that in Comparative Example 1 wherein the curing agent is not blended, the reworkability after the storage at a high temperature is poor, and in Comparative Example 2 wherein the probe tack of the non-adhesive resin layer exceeds 30 kN/m² and in Comparative Example 3 wherein the non-adhesive resin layer is not present, since the adequate adhesion property is not obtained, the workability is poor.

is lower than the tack property of the adhesive thermally conductive layer, the workability in the case of assembling an electronic component and a heat sink using the thermally conductive sheet is improved and the reworkability in the case where the article once assembled is used for a long period of time, disassembled and reassembled is also improved.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Sep. 13, 2013 (Japanese Patent Application No. 2013-190090) and a Japanese patent application filed on Sep. 10, 2014 (Japanese Patent Application No. 2014-183931), and the contents thereof are incorporated herein by reference.

| | Non-adhesive Resin Layer | | | | | | |
|---|---|---|---|---|---|---|---|
| | Resin | | | Curing Agent | | Flame Retardant Filler | |
| Example 1 | Polyvinyl Butyral (ESLEX BX-1 produced by Sekisui Chemical Co., Ltd.) | Tg: 90° C. | 100 Parts | Polyisocyanate Curing Agent (CORONATE HX produced by Nippon Polyurethane Industry Co., Ltd.) | 12 Parts | Melamine Cyanurate (STABIACE MC-5S produced by Sakai Chemical Industry Co., Ltd.) | 12 Parts |
| Example 2 | Acrylic Rubber (TEISANRESIN SG-80H-3 produced by Nagase ChemteX Corp.) | Tg: 11° C. | 100 Parts | Imidazole Curing Agent (NOVACURE HX3748 produced by Asahi Kasei E-materials Corp.) | 12 Parts | Melamine Cyanurate (STABIACE MC-5S produced by Sakai Chemical Industry Co., Ltd.) | 12 Parts |
| Comparative Example 1 | Polyvinyl Butyral (ESLEX BX-1 produced by Sekisui Chemical Co., Ltd.) | Tg: 90° C. | 100 Parts | None | | Melamine Cyanurate (STABIACE MC-5S produced by Sakai Chemical Industry Co., Ltd.) | 12 Parts |
| Comparative Example 2 | Acrylic Rubber (TEISANRESIN SG-80H-3 produced by Nagase ChemteX Corp.) | Tg: 11° C. | 100 Parts | None | | None | |
| Comparative Example 3 | None | | | None | | None | |

| | Non-adhesive Resin Layer Thickness (μm) | Non-adhesive Resin Layer | | Evaluation | |
|---|---|---|---|---|---|
| | | | | Thermally Conductive Sheet | |
| | | (a) Tack Property | (b) Appearance | (c) Heat Conductivity (W/m · K) | (d) Reworkability after Storage at High Temperature |
| Example 1 | 5 | Good | A | 2.31 | ○ |
| Example 2 | 15 | Good | A | 2.08 | ○ |
| Comparative Example 1 | 5 | Good | A | 2.22 | X |
| Comparative Example 2 | 15 | Too Large | B | 2.2 | X |
| Comparative Example 3 | None | Too Large | — | 2.38 | X |

INDUSTRIAL APPLICABILITY

According to the thermally conductive sheet of the invention, since the adhesive thermally conductive layer and the non-adhesive resin layer are laminated and the tack property of the non-adhesive resin layer is the adequate value, which

The invention claimed is:

1. A thermally conductive sheet in which an adhesive thermally conductive layer and a non-adhesive resin layer are laminated, wherein the adhesive thermally conductive layer contains an acrylic resin formed by curing an acrylic compound and a thermally conductive filler, and a tack property of the adhesive thermally conductive layer is higher than a tack property of the non-adhesive resin layer, and the non-adhesive resin layer is formed from a resin having a molecular weight in terms of number average molecular weight, greater than or equal to 100,000 and less than or equal to 500,000, the resin having a glass transition temperature greater than or equal to 10° C. and less than or equal to 110° C. and containing at least one functional group selected from
a hydroxy group,
a carboxyl group and
a glycidyl group,
a curing agent and
a flame retardant filler, and the tack property of the non-adhesive resin layer is from 6 to 30 kN/m2 as a probe tack measured by pressing an aluminum cylindrical probe on the non-adhesive resin layer and then peeling the aluminum cylindrical probe from the non-adhesive resin layer under conditions of pressing speed of 30 mm/min, peeling speed of 120 mm/min, load of 196 g, pressing time of 5.0 sec, pulling distance of 5 mm, probe heating of 40° C. and sheet stage heating of 40° C.

2. The thermally conductive sheet as claimed in claim 1, wherein the flame retardant filler is an organic filler selected from a cyanuric acid compound and an organic phosphate.

3. The thermally conductive sheet as claimed in claim 1, wherein an average particle diameter of the flame retardant filler is from 0.1 to 25 μm.

4. The thermally conductive sheet as claimed in claim 1, wherein a heat conductivity in a thickness direction of the thermally conductive sheet is 1.5 W/m·K or more.

5. The thermally conductive sheet as claimed in claim 1, wherein a glass transition temperature of the acrylic resin in the adhesive thermally conductive layer is from −80 to 15° C.

6. The thermally conductive sheet as claimed in claim 1, wherein the acrylic compound forming the adhesive thermally conductive layer is a monofunctional (meth)acrylate monomer.

7. The thermally conductive sheet as claimed in claim 1, wherein the adhesive thermally conductive layer contains from 20 to 80 parts by weight of a plasticizer and from 100 to 2,000 parts by weight of the thermally conductive filler based on 100 parts by weight of a monomer unit of the acrylic compound.

8. The thermally conductive sheet as claimed in claim 2, wherein an average particle diameter of the flame retardant filler is from 0.1 to 25 μm.

9. The thermally conductive sheet as claimed in claim 8, wherein a heat conductivity in a thickness direction of the thermally conductive sheet is 1.5 W/m·K or more.

10. The thermally conductive sheet as claimed in claim 8, wherein a glass transition temperature of the acrylic resin in the adhesive thermally conductive layer is from −80 to 15° C.

11. The thermally conductive sheet as claimed in claim 8, wherein the acrylic compound forming the adhesive thermally conductive layer is a monofunctional (meth)acrylate monomer.

12. The thermally conductive sheet as claimed in claim 8, wherein the adhesive thermally conductive layer contains from 20 to 80 parts by weight of a plasticizer and from 100 to 2,000 parts by weight of the thermally conductive filler based on 100 parts by weight of a monomer unit of the acrylic compound.

13. The thermally conductive sheet as claimed in claim 2, wherein a heat conductivity in a thickness direction of the thermally conductive sheet is 1.5 W/m·K or more.

14. The thermally conductive sheet as claimed in claim 2, wherein a glass transition temperature of the acrylic resin in the adhesive thermally conductive layer is from −80 to 15° C.

15. The thermally conductive sheet as claimed in claim 2, wherein the acrylic compound forming the adhesive thermally conductive layer is a monofunctional (meth)acrylate monomer.

16. The thermally conductive sheet as claimed in claim 2, wherein the adhesive thermally conductive layer contains from 20 to 80 parts by weight of a plasticizer and from 100 to 2,000 parts by weight of the thermally conductive filler based on 100 parts by weight of a monomer unit of the acrylic compound.

17. The thermally conductive sheet as claimed in claim 3, wherein a heat conductivity in a thickness direction of the thermally conductive sheet is 1.5 W/m·K or more.

18. The thermally conductive sheet as claimed in claim 3, wherein a glass transition temperature of the acrylic resin in the adhesive thermally conductive layer is from −80 to 15° C.

19. The thermally conductive sheet as claimed in claim 3, wherein the acrylic compound forming the adhesive thermally conductive layer is a monofunctional (meth)acrylate monomer.

20. The thermally conductive sheet as claimed in claim 3, wherein the adhesive thermally conductive layer contains from 20 to 80 parts by weight of a plasticizer and from 100 to 2,000 parts by weight of the thermally conductive filler based on 100 parts by weight of a monomer unit of the acrylic compound.

* * * * *